United States Patent [19]

Crane

[11] Patent Number: 4,853,950
[45] Date of Patent: Aug. 1, 1989

[54] IMPEDANCE MEASURING APPARATUS FOR R.F. BASEBAND SIGNALS OVER TWO WIRE TELEPHONE LINES

[75] Inventor: Ronald C. Crane, Mountain View, Calif.

[73] Assignee: 3Com Corporation, Santa Clara, Calif.

[21] Appl. No.: 114,330

[22] Filed: Oct. 29, 1987

[51] Int. Cl.$^4$ .............. H04B 3/46; G01R 31/02; G01R 31/11
[52] U.S. Cl. ................................. 379/24; 379/30; 324/58 R
[58] Field of Search ............... 379/6, 24, 30; 324/58 R, 58 A, 58 B; 370/17, 14

[56] References Cited

U.S. PATENT DOCUMENTS 4,734,637 3/1988 Chen et al. .............. 324/58 R

OTHER PUBLICATIONS

B. M. Oliver, "Time Domain Reflectometry," Hewlett-Packard Journal, vol. 15, No. 6, Feb. 1964.

*Primary Examiner*—Stafford D. Schreyer
*Attorney, Agent, or Firm*—Townsend and Townsend

[57] ABSTRACT

A simple impedance measuring tool is provided for performing an accurate but inexpensive determination of impedance and assurance of an impedance match in an installation environment. The apparatus operates according to a method wherein the average instantaneous voltage on a transmission line is sensed based on the integration of a series of reflections stimulated by a pulse generator. The apparatus comprises a fast repetitive pulse generator, a fast comparator, a flip-flop and a means for integrating the output of the flip-flop to produce an output voltage which can be read by a simple low-cost meter such as a d.c. voltmeter. The output of the comparator is coupled to the data input of the flip-flop, which is driven at its clock input by a variable phase clock output of the pulse generator. The absolute time delay or phase determines the distance at which the measurement is to be taken.

10 Claims, 1 Drawing Sheet

IMPEDANCE MEASURING APPARATUS FOR R.F. BASEBAND SIGNALS OVER TWO WIRE TELEPHONE LINES

BACKGROUND OF THE INVENTION

This invention relates to measurement of the length and the characteristic impedance at any point on the measured length of any wire medium, The invention is suited to the measurement of any wire medium, including coaxial cable or two-wire twisted pair telephone lines in the environment of a local area network used for digital communication. More particularly, this invention relates to the measurement of the pulse characteristic impedance of a medium for signals in a bandwidth in a range to microwave frequencies.

One of the challenges of office communications is to be able to communicate data signals through wire media without signal reflections. What is therefore needed is an apparatus which provides accurate and low-cost signal measurement.

Prior proposed solutions to the problem of measuring impedance have involved the use of a time domain reflectometer comprising a pulse generator and an analog oscilloscope combined in a unit suitable for use outside of a laboratory. Examples are the Tektronix Models 1502 and 1503 TDR cable testers. In order to properly utilize such an instrument, the operator must be sufficiently skilled and trained to operate the various controls and interpret the display of reflected signals on the screen of the internal oscilloscope.

The time domain reflectometry technique is old and well-known. The technique involves introducing a pulse excitation at a measurement point and observing the amplitude of the reflection over a range of time delays.

SUMMARY OF THE INVENTION

According to the invention, a simple impedance measuring tool is provided for performing an accurate but inexpensive determination of impedance and assurance of an impedance match in the installation environment. The apparatus operates according to a method wherein the average instantaneous voltage on a transmission line is sensed based on the integration of a series of reflections stimulated by a pulse generator such that the high speed measurement is converted to a form directly readable by a measuring device such as a d.c. voltmeter. The apparatus comprises a fast repetitive current pulse generator, a fast comparator, a flip-flop whose output is coupled in negative feedback relationship to the input of the comparator and a means for integrating the output of the flip-flop whose value can be measured by a simple meter. In one embodiment, the integrating means comprises a storage capacitor with a charge/discharge characteristic which is long compared to the parameter to be measured. The pulse generator is for generating negative-going pulses. The pulse generator is coupled to an input/output connector, and the input/output connector is also coupled to the noninverting input of the fast comparator connected in a voltage follower configuration. The output of the comparator is coupled to the data input of the flip-flop, which is driven at its clock input by a variable phase clock output of the pulse generator. The absolute time delay or phase determines the distance at which the measurement is to be taken. The noninverting output of the flip-flop is coupled in negative feedback to the inverting input of the comparator. The storage capacitor is coupled across the inverting input and a fixed reference such as ground. The current input to the storage capacitor is limited by a resistor or the like to assure a charging time constant which is long relative to the speed of pulse generator and comparator. Average instantaneous voltage is read by a galvanometer or the like across the storage capacitor.

The invention will be better understood by reference to the following detailed description in conjunction with the accompanying drawings.

DESCRIPTION OF SPECIFIC EMBODIMENTS

Figure 1:
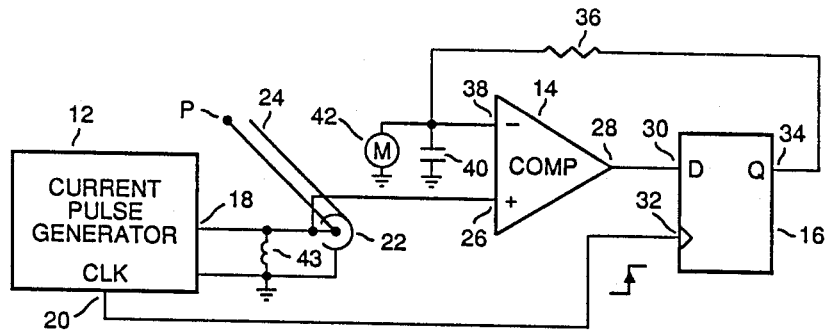
FIG. 1 is a simplified schematic diagram of a basic apparatus according to the invention.

Referring to FIG. 1 there is shown a simplified schematic diagram of a impedance meter 10 employing time domain reflectometry techniques for measuring impedance in accordance with the invention. The impedance meter 10 comprises a fast repetitive current pulse generator 12, a fast comparator 14 and a flip-flop 16. By fast it is meant of sufficient speed to generate and/or respond to individual pulses applied to a transmission line and reflected from an impedance discontinuity in the transmission line. The pulse generator 12 has a signal output port 18 and a clock port 20. The signal output port 18 is coupled to an input/output connector 22 which is designed for direct connection to a transmission medium or line 24 whose impedance is to be measured. The input/output connector 22 is also coupled to the noninverting input 26 of the comparator 14. Thus the comparator must have sufficient bandwidth to respond to pulses applied to and reflected by the transmission line 24. The output port 28 of the comparator 14 is coupled to the data input 30 of the flip-flop 16, and the clock port is coupled to the clock input port 32 of the flip-flop 16. The flip-flop 16 is operative to propagate the binary value at the data input port 30 upon a positive-going transition of the clock signal at clock input port 32 through the Q (noninverting) output port 34. In other words, the flip-flop 16 is used to sample the output of the comparator 14 during a time determined by the clock of the pulse generator 12.

The flip-flop output, acting as a current source at port 34, is coupled through an integrating resistor 36 in negative feedback relationship to the inverting input 38 of the comparator and to an integrating capacitor 40. The RC time constant of the capacitor 40 an the resistor 36 determine the charge time of the capacitor which is a means for integrating the output of the flip-flop 16. The output current which drives the capacitor 40 is a result of the last sampling operation of the flip-flop 16 when the clock output of the pulse generator 12 performs a low-to-high transition.

The charge stored in the capacitor 40 is a value which can be measured as a voltage by a simple meter 42 across the capacitor, which is typically coupled to ground. The charge/discharge characteristic of the capacitor 40 is long compared to the sample duration of the sample received through the flip-flop 16. The pulse generator 18 is for generating repetitive negative-going pulses. The input/output connector 22 is coupled to the noninverting input of the fast comparator 14 in a voltage follower configuration. Because of the clocked negative feedback, the integrated voltage at the inverting input 38 of the comparator 14 is driven to the instantaneous voltage at the noninverting input 26.

In a specific embodiment, an inductance means 43 may optionally be coupled across the transmission line 24 and preferably at the output port 18 of the pulse generator 12 wire media for compensating electrically for distance-related characteristics of said wire media due to finite conductivity and skin-depth phenomena. Specifically, because the cross-section of the wire conducting electricity is a function of frequency and thus is different for different components of a signal, the frequency-dependent skin depth of the cable gives rise to frequency-dependent reflection of energy. This gives rise to what is called a sending end overshoot phenomenon which is a characteristic of any finite conductivity medium and which can cause a 5 per cent to 10 percent error in the desired reading. Therefore, current induced in an inductance means 43 when the transmission line is excited by the current pulse generator 12 will substantially cancel the error in cable voltage related to this phenomenon. The value of inductance is dependent on wire type and gauge. An approximate value is given by the reciprocal of the percentage error introduced at a given time from the leading edge of a pulse multiplied by the nominal impedance of the class of cable ($L = Rt/e$). For a 24 gauge twisted pair cable, the inductance means may be a simple inductor having a value of approximately 3 mH. For comparison, for a 50 ohm-class coaxial cable (for which the invention might also be used), a value of approximately 1.5 mH is suitable.

Figure 2:
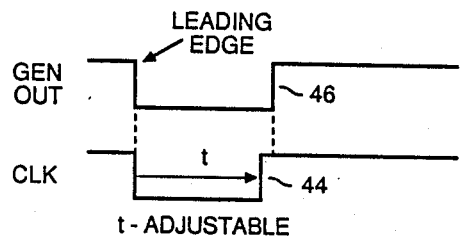
FIG. 2 is a timing diagram for elements of the apparatus of FIG. 1.

Referring to FIG. 2, the clock signal CLK which is synchronized with the pulse generator GEN OUT performs a low-to-high transition 44 at a selected fixed (but adjustable) time after the leading edge and prior to the trailing edge 46 of the generator pulse GEN OUT. Therefore, the variable phase clock output of the pulse generator causes the voltage comparison sample on the comparator to be made between the voltage on the transmission line 24 and the voltage on the capacitor 40 at a preselected instant after the leading edge of the pulse generator-generated pulse. That time corresponds to a preselected fixed position P on the transmission line 24.

The voltage on the capacitor 40, when charged in this manner, will be directly proportional to—and in fact approximately equal to—the voltage at the selected position P on the transmission line 24. At the time the capacitor 40 stabilizes, the duty cycle of the flip-flop 16 will stabilize, since the comparator 14, seeing the voltage on the capacitor 40, will switch at a stable duty cycle as the capacitor 40 charges and discharges with its relatively long time constant (compared to the reciprocal of the repetition rate of the pulse generator). If the magnitude of the repetition rate is high the ripple will be small. The duty cycle will tend to about 50% if the capacitor 40 is driven by a symmetrically-switched current source driven by the output of the flip-flop 16. The RC circuit approximates this value. The actual duty cycle is proportional to the ratio of the actual voltage which appears across the capacitor 40 to the output voltage of the flip-flop when ON (high).

The time constant of the capacitor 40 is typically in the range of tens to hundreds of milliseconds, while the instantaneous voltage which is being measured is based on repetitively-sampled readings made in the nanosecond time range.

Because the measurement is an average of many voltage pulses, small random voltage pulses which may be present on the transmission line 24 have little measurable effect on the reading of voltage made across the capacitor 40. There is a peak-to-peak ac voltage or ripple in the voltage on the capacitor 40. However, the effect of the ripple is attenuated in proportion to the ratio of the time constant of the capacitor 40 to the sample duration.

The voltage measured across the capacitor 40 can be readily calibrated to an impedance value to provide direct readout of impedance at the selected position P on the transmission line 24.

Figure 3:
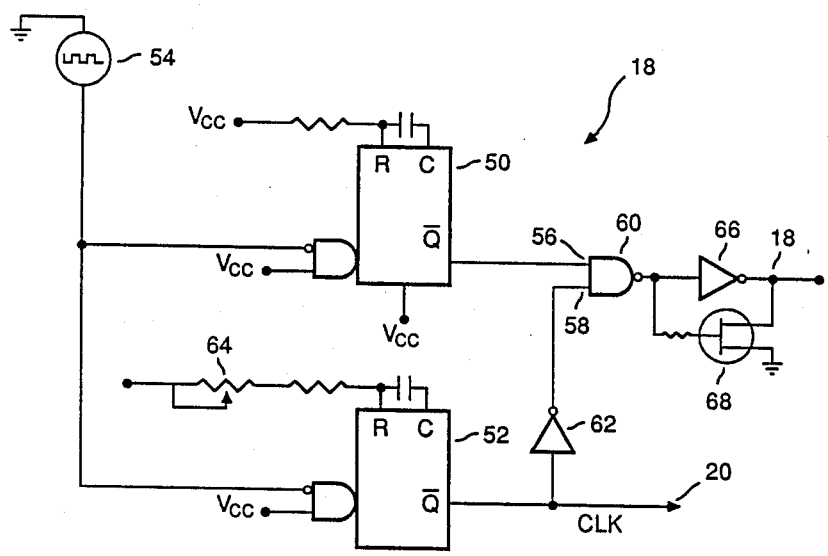
FIG. 3 is a schematic diagram of a specific embodiment of a pulse generator according to the invention.

Referring to FIG. 3, there is shown one embodiment of a pulse generator 12 in accordance with the invention. A first one-shot 50, a second one-shot 52 and a signal source 54 are provided. The first one-shot 50 and the second one-shot 52 constructed for example from a type LS123 dual one-shot package are each coupled to receive a clock input at a fixed frequency from the signal source 54 and each coupled to provide a output signal to respective first input terminal 56 and second input terminal 58 of a NAND gate 60 (through an inverter 62), the output of which is fed through an isolation amplifier 66 whose output is the signal output port 18. The direct output of the second one-shot 52 is the clock port 20.

In operation the first one-shot 50 produces a small fixed first time delay output, and the second one-shot 52 produces an adjustable second time delay output whose minimum time delay is exactly equal to the first time delay and whose maximum time delay is selected to be the minimum time delay plus the maximum round-trip time of a signal applied to the transmission line 24 to the position of desired measurement. Adjustment is for example controlled by a variable resistor 64. The net pulse produced by the dual one-shot is the output signal at the signal output port 18. The use of a dual one-shot scheme allows for generation of pulses whose length is variable from zero to an arbitrarily long maximum length. A conventional one-shot circuit is unable to produce pulses shorter than about 70 ns. In operation the pulse generator 12 produces a pulse each time the square wave signal source 54 produces a high to low transition. A 1 kHz pulse train is suitable.

Means may be provided as part of the amplifier 66 to clamp the voltage on the transmission line to a zero reference at the conclusion of a measurement interval. For this purpose an FET switch 68 may coupled across the output port 18. The FET switch 68 is an open circuit during the time current is applied to the transmission line 24.

The invention has now been explained with reference to a specific embodiment. Other embodiments will be apparent to those of ordinary skill in the art. For example, it will be recognized that the integrating means could be embodied in circuitry found within a standard digital voltmeter. Specifically, the comparator 14 and the flip-flop 16 may be coupled as part of the front end of a standard digital voltmeter incorporating an up-/down counter, wherein the up/down counter is used to drive a digital display and a digital-to-analog converter which produces a voltage at the input of the comparator 14 corresponding to the voltage on the transmission line 24 at the instant of sampling. Therefore, it is not intended that the invention be limited except as indicated by the appended claims.

I claim:

1. An apparatus for measuring the characteristic impedance of wire media at a preselected electrical distance from a measuring point comprising:
   a current pulse generator for applying a repeating step pulse of current to the wire media;
   means for adjusting a time delay, said time delay corresponding to the time at which a desired measurement is to occur relative to said applying step and being proportional to said preselected electrical distance from the output of a current pulse generator;
   means for sampling instantaneous voltage across the wire media at the output of the current pulse generator after said adjusted time delay immediately following said repeating step pulse to obtain an instantaneous sample comparison;
   means for integrating said instantaneous sample comparison over an averaging period of time to obtain an average instantaneous voltage for use as a comparison reference and as an output value representing said instantaneous voltage, said output value being directly representative of the characteristic impedance.

2. The apparatus according to claim 1 further including inductance means coupled across the wire media for compensating electrically for distance-related characteristics of the wire media due to finite conductivity and skin-depth phenomena.

3. The apparatus according to claim 1 wherein said sampling means comprises a flip-flop and a comparator, wherein a data output of said comparator is coupled to a data input of said flip-flop and said comparator is coupled to sense voltage from said integrating means at a first comparison terminal of said comparator and is adapted to be coupled to the wire media at a second comparison terminal in order to compare instantaneous voltage with integrated voltage and thereby to effect an output through said flip-flop having a duty cycle which varies with compared voltage.

4. The apparatus according to claim 3 wherein said flip-flop has a noninverting data output coupled to said integrating means and wherein said integrating means comprises a storage capacitor coupled between said first comparison terminal and a fixed reference such as ground, said storage capacitor having a charging time constant which is long compared with output pulse width of said flip-flop at said noninverting data output.

5. The apparatus according to claim 4 wherein said pulse generator is for generating negative-going pulses, said pulse generator being coupled to an input/output connector for connecting to the wire media, the input/output connector also being coupled to said second comparison terminal as a noninverting input of said comparator, said comparator being connected in a voltage follower configuration to said noninverting data input of said flip-flop.

6. The apparatus according to claim 5 wherein the noninverting data output of said flip-flop is coupled in negative feedback to said first comparison terminal of said comparator through a charging resistor for controlling charging time of said storage capacitor.

7. The apparatus according to claim 5 further including a d.c. voltmeter for reading voltage across said storage capacitor.

8. A method for measuring the characteristic impedance of a wire media at a preselected electrical distance from a measuring point comprising:
   applying a repeating step pulse of current from a current pulse generator to the wire media;
   adjusting a time delay, said time delay corresponding to the time at which a desired measurement is to occur relative to said applying step and being proportional to said preselected electrical distance from the output of said current pulse generator;
   sampling instantaneous voltage across the wire media at the output of the current pulse generator after said adjusted time delay immediately following said applying step to obtain an instantaneous sample comparison;
   integrating said instantaneous sample comparison over an averaging period of time to obtain an average instantaneous voltage for use as a comparison reference and as an output value representing said instantaneous voltage, said output value being directly representative of the characteristic impedance.

9. The method according to claim 8 wherein the sampling step comprises charging and discharging a storage capacitor as a function of a duty cycle of the output of a flip-flop sampling the output of a comparator.

10. The method according to claim 8 further including the step of compensating electrically for distance-related characteristics of said wire media due to finite conductivity and skin-depth phenomena.

* * * * *